United States Patent
Ahn et al.

(10) Patent No.: US 8,729,614 B2
(45) Date of Patent: May 20, 2014

(54) FLEXIBLE FERROELECTRIC MEMORY DEVICE AND MANUFACTURING METHOD FOR THE SAME

(75) Inventors: Jong-Hyun Ahn, Suwon-si (KR); Jonghyun Rho, Suwon-si (KR)

(73) Assignee: Sungkyunkwan University Foundation for Corporate Collaboration, Suwon-Si (KR)

( * ) Notice: Subject to any disclaimer, the term of this patent is extended or adjusted under 35 U.S.C. 154(b) by 25 days.

(21) Appl. No.: 13/115,268

(22) Filed: May 25, 2011

(65) Prior Publication Data

US 2011/0316059 A1     Dec. 29, 2011

(30) Foreign Application Priority Data

Jun. 29, 2010  (KR) .................. 10-2010-0062280

(51) Int. Cl.
    *H01L 21/02*     (2006.01)
(52) U.S. Cl.
    USPC ............ 257/295; 257/E29.272; 257/E21.436; 257/E21.663
(58) Field of Classification Search
    USPC ............ 257/295, E29.272, E21.436, E21.663
    See application file for complete search history.

(56) References Cited

U.S. PATENT DOCUMENTS

| | | | | | |
|---|---|---|---|---|---|
| 5,466,629 | A | * | 11/1995 | Mihara et al. | ............... 438/3 |
| 2001/0006252 | A1 | * | 7/2001 | Kim et al. | ............... 257/688 |

FOREIGN PATENT DOCUMENTS

| | | |
|---|---|---|
| JP | 08-078735 A | 3/1996 |
| KR | 10-0393197 B1 | 7/2003 |
| KR | 10-2006-0007779 A | 1/2006 |
| KR | 10-2009-0132874 A | 12/2009 |

OTHER PUBLICATIONS

Gergel-Hackett, et al., "A Flexible Solution-Processed Memristor," IEEE Electron Device Letters, vol. 30, No. 7, Jul. 2009, p. 706-708.
Park, et al., "Bendable and Transparent Barium Titanate Capacitors on Plastic Substrates for High Performance Flexible Ferroelectric Devices", Electrochemical and Solid-State Letters, 2010, vol. 13, issue 7, pp. G57-G59.

* cited by examiner

*Primary Examiner* — Amar Movva
(74) *Attorney, Agent, or Firm* — Pearne & Gordon LLP

(57) ABSTRACT

The present disclosure relates to a flexible nonvolatile ferroelectric memory device, a 1T-1R (1Transistor-1Resistor) flexible ferroelectric memory device, and a manufacturing method for the same.

8 Claims, 15 Drawing Sheets

FLEXIBLE FERROELECTRIC MEMORY DEVICE AND MANUFACTURING METHOD FOR THE SAME

CROSS-REFERENCE TO RELATED APPLICATION

This application claims the benefit of Korean Patent Application 10-2010-0062280, filed on Jun. 29, 2010, which is incorporated herein by reference.

FIELD OF THE INVENTION

The present disclosure relates to a flexible nonvolatile ferroelectric memory device, a 1T-1R (1Transistor-1Resistor) flexible ferroelectric memory device, and a manufacturing method for the same.

BACKGROUND OF THE INVENTION

A FeRAM (or FRAM) using a ferroelectric material having spontaneous polarization is a memory that stores "1" and "0" bits using remanent polarization and has attracted attention as a next-generation memory device since it has a lot of advantages such as low power consumption, rapid processing speed, and a simple configuration. The FeRAM stores information in two different types: a capacitor type (1 Transistor-1 capacitor type) in which a dielectric material of a capacitor of a DRAM is simply substituted by a ferroelectric material; and a transistor type (1 Transistor type) in which a gate dielectric film is substituted by a ferroelectric material. A capacitor-type device is a nonvolatile device but destroys data while reading the data, and, thus, the capacitor-type device needs to store the data again after reading the data. However, a transistor-type memory device can maintain data after reading the data and a single transistor serves as a memory device. Therefore, the transistor-type device has an advantage over the capacitor-type device in view of integration. Meanwhile, it is difficult to form a stable interface between a ferroelectric material and a semiconductor material, and, thus, a further study on a structure employing a dielectric film (MFIS structure) or a metal film and a dielectric film (MFMIS) serving as a buffer layer between the ferroelectric material and the semiconductor material is needed. As a material used for the buffer layer, a conductive material and an insulating material can be selectively used as necessary, and Pt, $RuO_x$ or $IrO_x$ may be used as the conductive material and an oxide such as $TiO_2$, $SrTiO_x$, $ZrO_2$, $LiNbO_3$ or $Al_2O_3$ may be used as the insulating material.

Flexible electronics have attracted considerable attention over the last decade owing to their range of applications, such as smart cards, biomedical sensors, and foldable antennas. To realize these applications, the development of flexible nonvolatile memory devices for data storage or radio-frequency transponders is required. Most flexible nonvolatile memory reported to date demonstrated organic materials, including small molecules and polymer organics because of their good mechanical bendability. However, a low degree of crystallinity associated with classes of materials results in relatively low performance of the as-fabricated devices. On the other hand, recent effort to address this issue explores a direct formation of high-quality inorganic materials onto plastic substrates through a sol-gel process to construct flexible memory with high performance. However, types of materials suitable for this process are limited.

BRIEF SUMMARY OF THE INVENTION

In order to solve the above-described problems, in the present disclosure, there is provided a transistor-type flexible nonvolatile ferroelectric memory device including a thin film transistor in which a polymer adhesive layer may be formed at an interface between a ferroelectric layer and a semiconductor channel layer and a manufacturing method for the same. Further, 1T-1R (1Transistor-1Resistor) flexible ferroelectric memory device and a manufacturing method for the same are provided in the present disclosure.

However, problems to be solved by the present disclosure are not limited to the above descriptions and other problems which have not been mentioned will be understood by those skilled in the art from the following descriptions.

In view of the foregoing, one aspect of the present disclosure provides a transistor-type flexible nonvolatile ferroelectric memory device including a thin film transistor in which a polymer adhesive layer may be formed at an interface between a ferroelectric layer and a semiconductor channel layer. The transistor-type flexible nonvolatile ferroelectric memory device may include a semiconductor channel layer formed on a flexible substrate; source/drain regions respectively formed on each side of the semiconductor channel layer; a polymer adhesive layer formed on the semiconductor channel layer; a first insulating layer formed on the polymer adhesive layer; a second insulating layer formed on the first insulating layer; a ferroelectric layer formed on the second insulating layer; a gate electrode formed on the ferroelectric layer; and, source/drain electrodes respectively formed on the source/drain regions.

In an embodiment, each of the first insulating layer and the second insulating layer includes, but is not limited to, a material independently selected from a group consisting of $TiO_2$, $SrTiO_x$, $ZrO_2$, $LiNbO_2$, $Al_2O_3SiO_2$ and a combination thereof. As a non-limiting example, the first insulating layer and the second insulating layer may include the same material depending on selectivity with respect to a sacrificial layer.

In another embodiment, the polymer adhesive layer includes, but is not limited to, a material selected from a group consisting of epoxy resin, cytop, polyimide, benzocyclobutene, polydimethylsiloxane (PDMS), PMMA (Poly(methylmethacrylate)), polyurethane, polyvinylphenol, and a combination thereof. By way of example, the epoxy resin includes, but is not limited to, Su-8.

In still another embodiment, the ferroelectric layer includes, but is not limited to, a material selected from a group consisting of PZT (Lead Zirconate Titanate), PLZT (Lanthanum-modified Lead Zirconate Titanate), BLT (Bismuth Lanthanum Titanate), BST (Barium Strontium Titanate), SBT (Strontium Bismuth Tantalate) and a combination thereof. By way of example, the PZT can be expressed as, but not limited to, $[Pb(Zr_xTi_{1-x})O_3]$ in which x is greater than about 0.2 and less than about 0.8, the PLZT can be expressed as, but not limited to, $[(Pb_{1-y}La_y)(Zr_xTi_{1-x})O_3]$ in which x is greater than about 0.2 and less than about 0.8 and y is greater than about 0.01 and less than about 0.2, the BLT can be expressed as, but not limited to, $[Bi_{4-x}La_xTi_3O_{12}]$ in which x is greater than about 0.1 and less than about 2, the BST can be expressed as, but not limited to, $[(Ba_xSr_{1-x})TiO_3]$ in which x is greater than about 0.5 and less than about 1, and the SBT can be expressed as, but not limited to, $[Sr_xBi_yTa_2O_9]$ in which x is greater than about 0.5 and less than about 1.5 and y is greater than about 1.5 and less than about 3.

In still another embodiment, the ferroelectric layer is formed by, but is not limited to, a vacuum deposition or a sol-gel method. By way of example, the ferroelectric layer may be formed by, but not limited to, chemical vapor deposition (CVD), physical vapor deposition (PVD), sputtering, pulsed laser deposition (PLD) or a sol-gel method.

A material forming the semiconductor channel layer is not limited, and the semiconductor channel layer may be formed using a semiconductor material known in the art. For example, the semiconductor channel layer may be formed using Si, a compound semiconductor, an oxide semiconductor, an organic semiconductor, carbon nanotube, or graphene, but not limited thereto.

In another aspect of the present disclosure, there is provided a manufacturing method for a transistor-type flexible nonvolatile ferroelectric memory device including a thin film transistor in which a polymer adhesive layer may be formed at an interface between a ferroelectric layer and a semiconductor channel layer. The manufacturing method for the transistor-type flexible nonvolatile ferroelectric memory device including a thin film transistor in which a polymer adhesive layer may be formed at an interface between a ferroelectric layer and a semiconductor channel layer may include, but is not limited to, forming a sacrificial layer on a substrate; forming a first insulating layer and a second insulating layer in sequence on the sacrificial layer; forming a ferroelectric layer on the second insulating layer; forming a ferroelectric gate by forming a gate electrode on the ferroelectric layer; after etching and removing the sacrificial layer, transferring the ferroelectric gate onto a flexible substrate, on which a semiconductor channel layer on each side of which source/drain regions are respectively formed and a polymer adhesive layer are deposited in sequence, by bringing a stamp into contact with the ferroelectric gate; etching and removing the polymer adhesive layer except the polymer adhesive layer formed under the ferroelectric gate; forming source/drain electrodes respectively on the source/drain regions.

In an embodiment, each of the first insulating layer and the second insulating layer includes, but is not limited to, a material independently selected from a group consisting of $TiO_2$, $SrTiO_x$, $ZrO_2$, $LiNbO_3$, $Al_2O_3$, $SiO_2$ and a combination thereof. As a non-limiting example, the first insulating layer and the second insulating layer may include the same material depending on selectivity with respect to a sacrificial layer.

In another embodiment, the polymer adhesive layer includes, but is not limited to, a material selected from a group consisting of photoresist (PR), epoxy resin, cytop, polyimide, benzocyclobutene, polydimethylsiloxane (PDMS), PMMA (Poly(methylmethacrylate)), polyurethane, polyvinylphenol, and a combination thereof. By way of example, the epoxy resin includes, but is not limited to, Su-8. By way of example, if epoxy resin such as Su-8 is used as the polymer adhesive layer, a heating process or UV-curing process may be further included in the method after forming the polymer adhesive layer.

In still another embodiment, the ferroelectric layer includes, but is not limited to, a material selected from a group consisting of PZT (Lead Zirconate Titanate), PLZT (Lanthanum-modified Lead Zirconate Titanate), BLT (Bismuth Lanthanum Titanate), BST (Barium Strontium Titanate), SBT (Strontium Bismuth Tantalate) and a combination thereof. By way of example, the PZT can be expressed as, but not limited to, $[Pb(Zr_xTi_{1-x})O_3]$ in which x is greater than about 0.2 and less than about 0.8, the PLZT can be expressed as, but not limited to, $[(Pb_{1-y}La_y)(Zr_xTi_{1-x})O_3]$ in which x is greater than about 0.2 and less than about 0.8 and y is greater than about 0.01 and less than about 0.2, the BLT can be expressed as, but not limited to, $[Bi_{4-x}La_xTi_3O_{12}]$ in which x is greater than about 0.1 and less than about 2, the BST can be expressed as, but not limited to, $[(Ba_xSr_{1-x})TiO_3]$ in which x is greater than about 0.5 and less than about 1, and the SBT can be expressed as, but not limited to, $[Sr_xBi_yTa_2O_9]$ in which x is greater than about 0.5 and less than about 1.5 and y is greater than about 1.5 and less than about 3.

However, it may be understood by those skilled in the art that a structure of the transistor-type flexible nonvolatile ferroelectric memory device in accordance with the present disclosure can be applied to various other structures known in the art.

In still another aspect of the present disclosure, there is provided, but is not limited to, a transistor-type flexible nonvolatile ferroelectric memory device comprising a semiconductor channel layer formed on a flexible substrate; source/drain regions formed on each side of the semiconductor channel layer; a barrier layer formed on the semiconductor channel layer; a ferroelectric layer formed on the barrier layer; source/drain electrodes formed on the source/drain regions, respectively; and a gate electrode formed on the ferroelectric layer.

In an embodiment, the barrier layer is an insulating layer. By way of example, the insulating barrier layer includes, but is not limited to, a material selected from a group consisting of $TiO_2$, $SrTiO_x$, $ZrO_2$, $LiNbO_2$, $Al_2O_3$, $SiO_2$ and a combination thereof.

In another embodiment, the ferroelectric layer includes, but is not limited to, a material selected from a group consisting of PZT (Lead Zirconate Titanate), PLZT (Lanthanum-modified Lead Zirconate Titanate), BLT (Bismuth Lanthanum Titanate), BST (Barium Strontium Titanate), SBT (Strontium Bismuth Tantalate) and a combination thereof. By way of example, the PZT can be expressed as, but not limited to, $[Pb(Zr_xTi_{1-x})O_3]$ in which x is greater than about 0.2 and less than about 0.8, the PLZT can be expressed as, but not limited to, $[(Pb_{1-y}La_y)(Zr_xTi_{1-x})O_3]$ in which x is greater than about 0.2 and less than about 0.8 and y is greater than about 0.01 and less than about 0.2, the BLT can be expressed as, but not limited to, $[Bi_{4-x}La_xTi_3O_{12}]$ in which x is greater than about 0.1 and less than about 2, the BST can be expressed as, but not limited to, $[(Ba_xSr_{1-x})TiO_3]$ in which x is greater than about 0.5 and less than about 1, and the SBT can be expressed as, but not limited to, $[Sr_xBi_yTa_2O_9]$ in which x is greater than about 0.5 and less than about 1.5 and y is greater than about 1.5 and less than about 3.

In still another embodiment, the ferroelectric layer is formed by, but is not limited to, a vacuum deposition or a sol-gel method. By way of example, the ferroelectric layer may be formed by, but not limited to, chemical vapor deposition (CVD), physical vapor deposition (PVD), sputtering, pulsed laser deposition (PLD) or a sol-gel method.

A material forming the semiconductor channel layer is not limited, and the semiconductor channel layer may be formed using a semiconductor material known in the art. For example, the semiconductor channel layer may be formed using Si, a compound semiconductor, an oxide semiconductor, an organic semiconductor, carbon nanotube, or graphene, but not limited thereto.

However, it may be understood by those skilled in the art that a structure of the transistor-type flexible nonvolatile ferroelectric memory device in accordance with the present disclosure can be applied to various other structures known in the art.

In still another aspect of the present disclosure, there is provided a manufacturing method for a transistor-type flexible nonvolatile ferroelectric memory device.

In an embodiment, the manufacturing method for a transistor-type flexible nonvolatile ferroelectric memory device includes, but is not limited to, forming a sacrificial layer on a substrate; forming a semiconductor channel layer on the sacrificial layer; forming source/drain regions respectively on each side of the semiconductor channel layer by patterning the semiconductor channel layer; forming a barrier layer on the semiconductor channel layer which the source/drain regions are formed; forming a ferroelectric layer on the barrier layer; patterning the barrier layer and the ferroelectric layer; forming a protection layer on a pattern formed by patterning the ferroelectric layer; after etching and removing the sacrificial layer, transferring the semiconductor channel layer, the barrier layer, and the ferroelectric layer onto a flexible substrate, and removing the protection layer; forming source/drain electrodes respectively on the semiconductor channel layer and the source/drain regions; and, forming a gate electrode on the ferroelectric layer.

In another embodiment, the barrier layer includes, but is not limited to, a material selected from a group consisting of $TiO_2$, $SrTiO_x$, $ZrO_2$, $LiNbO_3$, $Al_2O_3$, $SiO_2$ and a combination thereof.

In still another embodiment, the protection layer includes, but is not limited to, a photoresist. The photoresist can be appropriately selected by those skilled in the art from those publicly known in the art and used without limit. By way of example, the protection layer may include a polymer material selected from, but not limited to, a group consisting of photoresist (PR), epoxy resin, cytop, polyimide, benzocyclobutene, polydimethylsiloxane (PDMS), PMMA (Poly(methylmethacrylate)), polyurethane, polyvinylphenol, and a combination thereof. By way of example, the epoxy resin may include, but is not limited to, Su-8. By way of example, if epoxy resin such as Su-8 is used as the polymer adhesive layer, a heating process or UV-curing process may be further included in the method after forming the polymer adhesive layer.

In still another embodiment, the ferroelectric layer includes, but is not limited to, a material selected from a group consisting of PZT (Lead Zirconate Titanate), PLZT (Lanthanum-modified Lead Zirconate Titanate), BLT (Bismuth Lanthanum Titanate), BST (Barium Strontium Titanate), SBT (Strontium Bismuth Tantalate) and a combination thereof. By way of example, the PZT can be expressed as, but not limited to, $[Pb(Zr_xTi_{1-x})O_3]$ in which x is greater than about 0.2 and less than about 0.8, the PLZT can be expressed as, but not limited to, $[(Pb_{1-y}La_y)(Zr_xTi_{1-x})O_3]$ in which x is greater than about 0.2 and less than about 0.8 and y is greater than about 0.01 and less than about 0.2, the BLT can be expressed as, but not limited to, $[Bi_{4-x}La_xTi_3O_{12}]$ in which x is greater than about 0.1 and less than about 2, the BST can be expressed as, but not limited to, $[(Ba_xSr_{1-x})TiO_3]$ in which x is greater than about 0.5 and less than about 1, and the SBT can be expressed as, but not limited to, $[Sr_xBi_yTa_2O_9]$ in which x is greater than about 0.5 and less than about 1.5 and y is greater than about 1.5 and less than about 3.

In still another embodiment, the ferroelectric layer is formed by, but is not limited to, a vacuum deposition or a sol-gel method. By way of example, the ferroelectric layer may be formed by, but not limited to, chemical vapor deposition (CVD), physical vapor deposition (PVD), sputtering, pulsed laser deposition (PLD) or a sol-gel method.

A material forming the semiconductor channel layer is not limited, and the semiconductor channel layer may be formed using a semiconductor material known in the art. For example, the semiconductor channel layer may be formed using Si, a compound semiconductor, an oxide semiconductor, an organic semiconductor, carbon nanotube, or graphene, but not limited thereto.

In still another aspect of the present disclosure, there is provided a 1T-1R (1Transistor-1Resistor) flexible ferroelectric memory device comprising, but is not limited to, a semiconductor channel layer formed on a flexible substrate; source/drain regions respectively formed on each side of the semiconductor channel layer; a barrier layer formed on the drain region; a ferroelectric layer formed on the barrier layer; an insulating layer formed on the semiconductor channel layer and the ferroelectric layer; and source/drain electrodes respectively formed on the source/drain regions.

In an embodiment, the barrier layer includes, but is not limited to, a material selected from a group consisting of Pt, Ir, Ru, Rh, SrO, PdO, $IrO_x$, $RuO_x$, $RhO_x$, $OsO_x$ and a combination thereof.

In another embodiment, the ferroelectric layer includes, but is not limited to, a material selected from a group consisting of PZT (Lead Zirconate Titanate), PLZT (Lanthanum-modified Lead Zirconate Titanate), BLT (Bismuth Lanthanum Titanate), BST (Barium Strontium Titanate), SBT (Strontium Bismuth Tantalate) and a combination thereof. By way of example, the PZT can be expressed as, but not limited to, $[Pb(Zr_xTi_{1-x})O_3]$ in which x is greater than about 0.2 and less than about 0.8, the PLZT can be expressed as, but not limited to, $[(Pb_{1-y}La_y)(Zr_xTi_{1-x})O_3]$ in which x is greater than about 0.2 and less than about 0.8 and y is greater than about 0.01 and less than about 0.2, the BLT can be expressed as, but not limited to, $[Bi_{4-x}La_xTi_3O_{12}]$ in which x is greater than about 0.1 and less than about 2, the BST can be expressed as, but not limited to, $[(Ba_xSr_{1-x})TiO_3]$ in which x is greater than about 0.5 and less than about 1, and the SBT can be expressed as, but not limited to, $[Sr_xBi_yTa_2O_9]$ in which x is greater than about 0.5 and less than about 1.5 and y is greater than about 1.5 and less than about 3.

In still another embodiment, the ferroelectric layer is formed by, but is not limited to, a vacuum deposition or a sol-gel method. By way of example, the ferroelectric layer may be formed by, but not limited to, chemical vapor deposition (CVD), physical vapor deposition (PVD), sputtering, pulsed laser deposition (PLD) or a sol-gel method.

A material forming the semiconductor channel layer is not limited, and the semiconductor channel layer may be formed using a semiconductor material known in the art. For example, the semiconductor channel layer may be formed using Si, a compound semiconductor, an oxide semiconductor, an organic semiconductor, carbon nanotube, or graphene, but not limited thereto.

In still another aspect of the present disclosure, there is provided a manufacturing method for a 1T-1R (1Transistor-1Resistor) flexible ferroelectric memory device.

In an embodiment, the manufacturing method for a 1T-1R (1Transistor-1Resistor) flexible ferroelectric memory device includes, but is not limited to, forming a sacrificial layer on a substrate, forming a semiconductor channel layer on the sacrificial layer, forming source/drain regions on each side of the semiconductor channel layer by patterning and doping the semiconductor channel layer, forming a barrier layer on the drain region, forming a ferroelectric layer on the barrier layer, patterning the barrier layer and the ferroelectric layer, after etching and removing the sacrificial layer, transferring the semiconductor channel layer, the barrier layer, and the ferroelectric layer onto a flexible substrate, forming an insulating layer between the source/drain regions, and forming electrodes on the source region, the insulating layer and the ferroelectric layer.

In another embodiment, the barrier layer includes, but is not limited to, a material selected from a group consisting of Pt, Ir, Ru, Rh, SrO, PdO, $IrO_x$, $RuO_x$, $RhO_x$, $OsO_x$ and a combination thereof.

In still another embodiment, the ferroelectric layer includes, but is not limited to, a material selected from a group consisting of PZT (Lead Zirconate Titanate), PLZT (Lanthanum-modified Lead Zirconate Titanate), BLT (Bismuth Lanthanum Titanate), BST (Barium Strontium Titanate), SBT (Strontium Bismuth Tantalate) and a combination thereof. By way of example, the PZT can be expressed as, but not limited to, $[Pb(Zr_xTi_{1-x})O_3]$ in which x is greater than about 0.2 and less than about 0.8, the PLZT can be expressed as, but not limited to, $[(Pb_{1-y}La_y)(Zr_xTi_{1-x})O_3]$ in which x is greater than about 0.2 and less than about 0.8 and y is greater than about 0.01 and less than about 0.2, the BLT can be expressed as, but not limited to, $[Bi_{4-x}La_xTi_3O_{12}]$ in which x is greater than about 0.1 and less than about 2, the BST can be expressed as, but not limited to, $[(Ba_xSr_{1-x})TiO_3]$ in which x is greater than about 0.5 and less than about 1, and the SBT can be expressed as, but not limited to, $[Sr_xBi_yTa_2O_9]$ in which x is greater than about 0.5 and less than about 1.5 and y is greater than about 1.5 and less than about 3.

In still another embodiment, the ferroelectric layer is formed by, but is not limited to, a vacuum deposition or a sol-gel method. By way of example, the ferroelectric layer may be formed by, but not limited to, chemical vapor deposition (CVD), physical vapor deposition (PVD), sputtering, pulsed laser deposition (PLD) or a sol-gel method.

In still another embodiment, the protection layer includes, but is not limited to, a photoresist.

A material forming the semiconductor channel layer is not limited, and the semiconductor channel layer may be formed using a semiconductor material known in the art. For example, the semiconductor channel layer may be formed using Si, a compound semiconductor, an oxide semiconductor, an organic semiconductor, carbon nanotube, or graphene, but not limited thereto.

In accordance with the present disclosure, a transistor-type flexible nonvolatile ferroelectric memory device showing excellent electrical and mechanical properties and having flexibility, a 1T-1R flexible ferroelectric memory device, and a manufacturing method for the same are provided, and these technologies can be applied to a flexible electric and electronic system in various ways. Further, in accordance with the present disclosure, a ferroelectric layer is formed and transferred onto a flexible substrate so as to manufacture a transistor-type flexible nonvolatile ferroelectric memory device, and, thus, the memory device may have a wide range of applications owing to easiness in processing and suitability in continuous processes.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
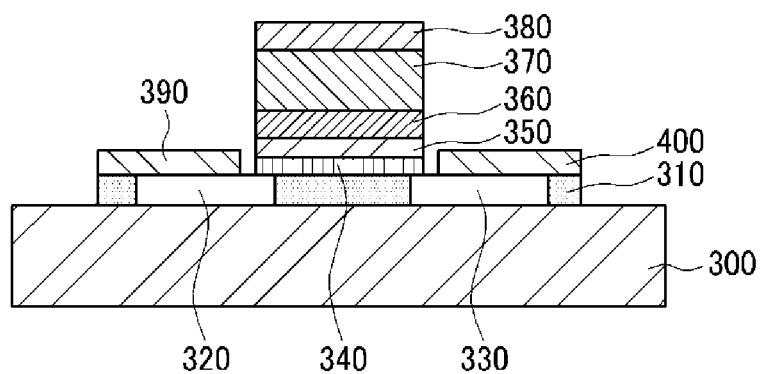
FIG. 1 is a cross-sectional view of a transistor-type flexible nonvolatile ferroelectric memory device in accordance with an embodiment of the present disclosure.

Hereinafter, embodiments and examples of the present invention will be described in detail with reference to the accompanying drawings so that the present invention may be readily implemented by those skilled in the art.

However, it is to be noted that the present invention is not limited to the embodiments but can be realized in various other ways. In the drawings, parts irrelevant to the description are omitted for the simplicity of explanation, and like reference numerals denote like parts through the whole document.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "on" that is used to designate a position of one layer or one element with respect to another layer or another element includes both a case that the one layer or the one element is adjacent to the another layer or the another element and a case that any other layer or element exists between these two layers or elements. Through the whole document, the term "step of" does not mean "step for".

The terms "about or approximately" or "substantially" are intended to have meanings close to numerical values or ranges specified with an allowable error and intended to prevent accurate or absolute numerical values disclosed for understanding of the present invention from being illegally or unfairly used by any unconscionable third party.

FIG. 1 is a cross-sectional view of a transistor-type flexible nonvolatile ferroelectric memory device in accordance with an embodiment of the present disclosure, and FIGS. 2A to 2F are schematic diagrams showing a manufacturing method for a transistor-type flexible nonvolatile ferroelectric memory device in accordance with an embodiment of the present disclosure.

Referring to FIG. 1, a nonvolatile ferroelectric memory device in accordance with an embodiment of the present disclosure may include a semiconductor channel layer 310 formed on a flexible substrate 300, source/drain regions 320 and 330 formed on each side of the semiconductor channel layer 310, a polymer adhesive layer 340 formed on the semiconductor channel layer 310, a first insulating layer 350 formed on the polymer adhesive layer 340, a second insulating layer 360 formed on the first insulating layer 350, a ferroelectric layer 370 formed on the second insulating layer 360, a gate electrode 380 formed on the ferroelectric layer 370, and source/drain electrodes 390 and 400 formed on the source/drain regions 320 and 330, respectively.

Hereinafter, a manufacturing method for a transistor-type ferroelectric nonvolatile memory device in accordance with an embodiment of the present disclosure will be explained in detail with reference to FIGS. 2A to 2F.

A first insulating layer 420 may be formed on a substrate 410. The first insulating layer 420 may be formed by, for example, wet thermal oxidation.

Then, a sacrificial layer 430 may be formed on the first insulating layer 420 and the first insulating layer 350 may be formed thereon. The first insulating layers 350 and 420 may include, for example, but is not limited to, an oxide film such as a silicon oxide film. Thereafter, the second insulating layer 360 may be formed on the first insulating layer 350. Each of the first insulating layer 350 and the second insulating layer 360 may include a material independently selected from, but not limited to, a group consisting of $TiO_2$, $SrTiO_x$, $ZrO_2$, $LiNbO_3$, $Al_2O_3$, $SiO_2$ and a combination thereof. As a non-limiting example, the first insulating layers 350 and 420 and the second insulating layer 360 may include the same material depending on selectivity with respect to the sacrificial layer 430.

Figure 2A:
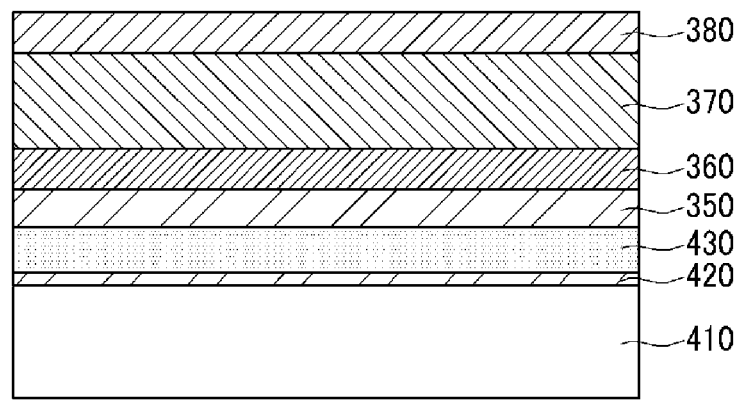
FIGS. 2A to 2F are schematic diagrams showing a manufacturing method for a transistor-type flexible nonvolatile ferroelectric memory device in accordance with an embodiment of the present disclosure.
Figure 2B:
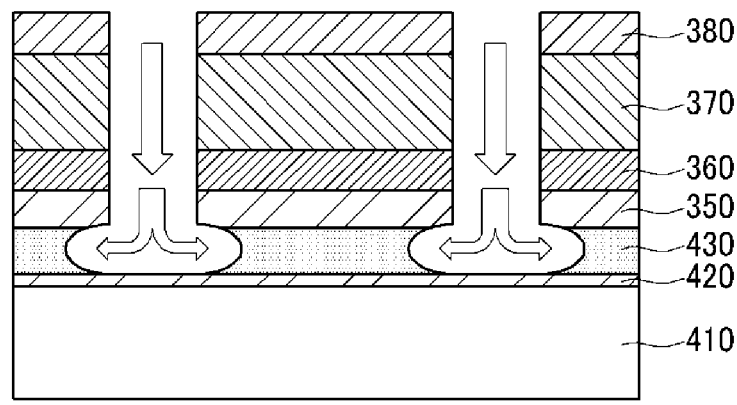
Figure 2C:
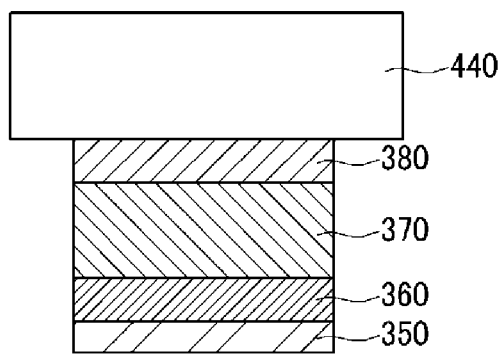
Figure 2D:
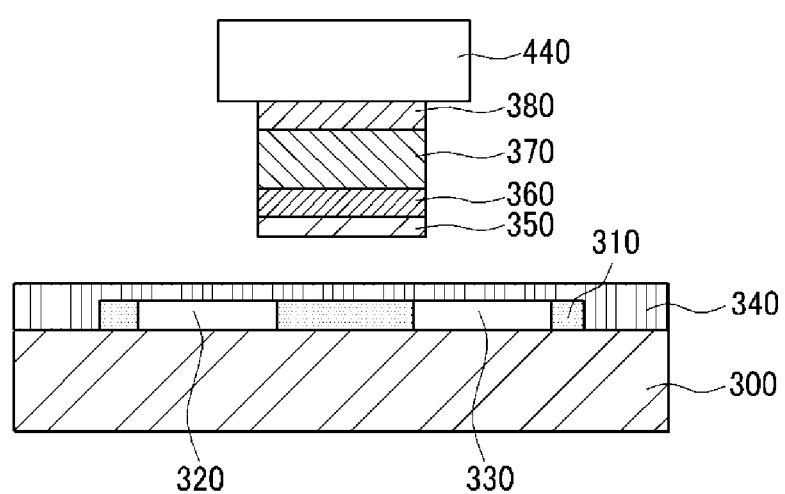
Figure 2E:
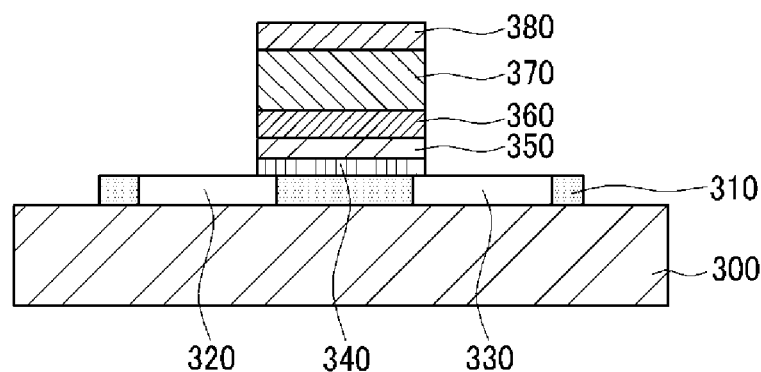

Subsequently, the ferroelectric layer 370 may be formed on the second insulating layer 360 (FIG. 2A). The ferroelectric layer 370 may include a material selected from, but not limited to, a group consisting of PZT (Lead Zirconate Titanate), PLZT (Lanthanum-modified Lead Zirconate Titanate), BLT (Bismuth Lanthanum Titanate), BST (Barium Strontium Titanate), SBT (Strontium Bismuth Tantalate) and a combination thereof. By way of example, the PZT can be expressed as, but not limited to, $[Pb(Zr_xTi_{1-x})O_3]$ in which x is greater than about 0.2 and less than about 0.8, the PLZT can be expressed as, but not limited to, $[(Pb_{1-y}La_y)(Zr_xTi_{1-x})O_3]$ in which x is greater than about 0.2 and less than about 0.8 and y is greater than about 0.01 and less than about 0.2, the BLT can be expressed as, but not limited to, $[Bi_{4-x}La_xTi_3O_{12}]$ in which x is greater than about 0.1 and less than about 2, the BST can be expressed as, but not limited to, $[(Ba_xSr_{1-x})TiO_3]$ in which x is greater than about 0.5 and less than about 1, and the SBT can be expressed as, but not limited to, $[Sr_xBi_yTa_2O_9]$ in which x is greater than about 0.5 and less than about 1.5 and y is greater than about 1.5 and less than about 3. The ferroelectric layer 370 may be formed by, for example, but not limited to, chemical vapor deposition (CVD), physical vapor deposition (PVD), sputtering, pulsed laser deposition (PLD) or a sol-gel method.

Then, the gate electrode 380 may be formed on the ferroelectric layer 370. The gate electrode 380 may include, but is not limited to, a metal selected from a group consisting of, for example, Ag, Au, Ni, Pt, Pd, Ir, Rh, Ta, W, Ti, Mo, Al, Cu and a combination thereof or a conductive oxide publicly known in the art. The gate electrode 380 may be formed by, but not limited to, sputtering, e-beam evaporation, thermal evaporation, pulsed laser deposition (PLD), chemical vapor deposition (CVD), and atomic layer deposition (ALD) and may be patterned by, but not limited to, photolithography or lift-off.

Thereafter, after the sacrificial layer 430 is removed by etching, a ferroelectric gate made up of the first insulating layer 350, the second insulating layer 360, the ferroelectric layer 370, and the gate electrode 380 may be brought into contact with a stamp 440 to be separated from the substrate 410 (FIGS. 2B and 2C) and the separated ferroelectric gate may be transferred onto the flexible substrate 300 on which the semiconductor channel layer 310 and the polymer adhesive layer 340 (FIGS. 2D and 2E) are formed. A material forming the semiconductor channel layer 310 is not limited, and the semiconductor channel layer 310 may be formed using a semiconductor material known in the art. For example, the semiconductor channel layer may be formed using Si, a compound semiconductor, an oxide semiconductor, an organic semiconductor, carbon nanotube, or graphene, but not limited thereto. The stamp 440 may be made of, but not limited to, an elastic polymer. By way of example, the stamp 440 may include a material selected from, for example, but not limited to, a group consisting of polydimethylsiloxane, poly(methyl methacrylate), polyurethane, polyimide, Teflon, cross-linked novolac resin (phenol formaldehyde resin) and a combination thereof.

In the semiconductor channel layer 310 formed on the flexible substrate 300, the source/drain regions 320 and 330 may be formed, and the polymer adhesive layer 340 formed on the semiconductor channel layer 310 may include a material selected from, for example, but not limited to, a group consisting of epoxy resin, cytop, polyimide, benzocyclobutene, polydimethylsiloxane (PDMS), PMMA (Poly(m-ethylmethacrylate)), polyurethane, polyvinylphenol, and a combination thereof. By way of example, the epoxy resin may include, but is not limited to, Su-8.

The flexible substrate 300 may include a material selected from, for example, but not limited to, a group consisting of polyethersulfone, polyacrylate, polyetherimide, polyethylene naphthalate, polyethylene terephthalate, polyphenylene sulfide, polyarylate, polyimide, polycarbonate, cellulose triacetate, cellulose acetate, propionate, arylite and a combination thereof.

Subsequently, except the polymer adhesive layer 340 formed under the ferroelectric gate, the polymer adhesive layer 340 may be removed by etching. In this case, the polymer adhesive layer 340 may be etched through, for example, an oxygen plasma process.

The ferroelectric gate may be transferred onto the semiconductor channel layer 310 via the polymer adhesive layer 340 serving as an adhesive layer, and then a process of hardening the polymer adhesive layer 340 may be further performed.

Figure 2F:
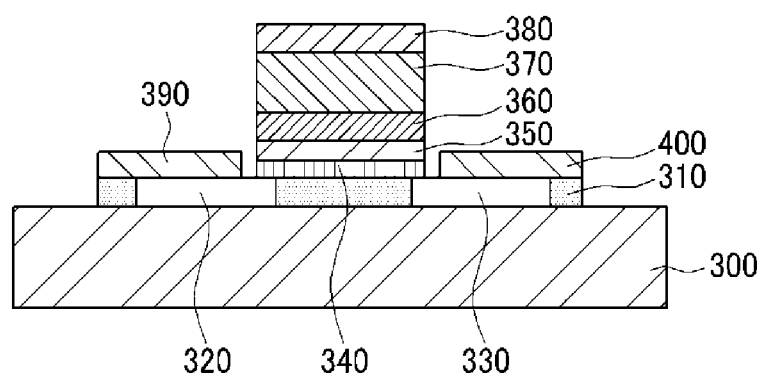

Finally, the source/drain electrodes 390 and 400 may be formed on the source/drain regions 320 and 330, respectively (FIG. 2F). The source/drain electrodes 390 and 400 may include a metal selected from a group consisting of, for example, Ag, Au, Ni, Pt, Pd, Ir, Rh, Ta, W, Ti, Mo, Al, Cu and a combination thereof or a conductive oxide publicly known in the art. The source/drain electrodes 390 and 400 may be formed by the same method for forming the gate electrode 380, and, thus, a redundant explanation thereof will be omitted herein.

The transistor-type ferroelectric nonvolatile memory device in accordance with an embodiment of the present disclosure can be manufactured through the above-described processes.

Figure 3:
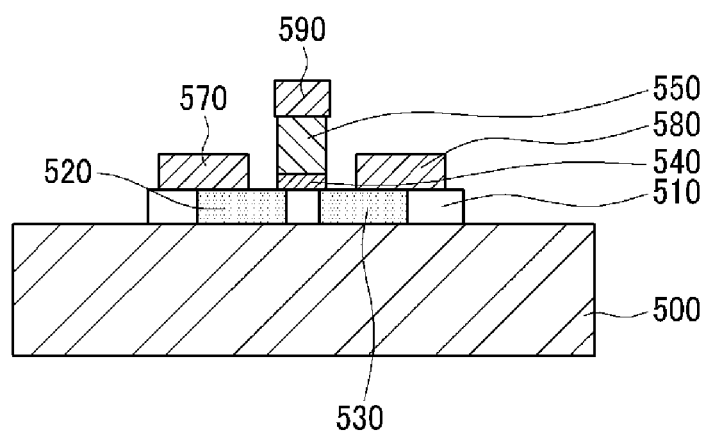
FIG. 3 is a cross-sectional view of a transistor-type flexible nonvolatile ferroelectric memory device in accordance with an embodiment of the present disclosure.

FIG. 3 is a cross-sectional view of a transistor-type flexible nonvolatile ferroelectric memory device in accordance with an embodiment of the present disclosure and FIGS. 4A to 4E are schematic diagrams showing a manufacturing method for a transistor-type flexible nonvolatile ferroelectric memory device in accordance with an embodiment of the present disclosure.

Referring to FIG. 3, a transistor-type flexible nonvolatile ferroelectric memory device in accordance with an embodiment of the present disclosure may include a semiconductor channel layer 510 formed on a flexible substrate 500, source/drain regions 520 and 530 formed on each side of the semiconductor channel layer 510, a barrier layer 540 and a ferroelectric layer 550 formed in sequence on the semiconductor channel layer 510, source/drain electrodes 570 and 580 formed on the source/drain regions 520 and 530, respectively and a gate electrode 590 formed on the ferroelectric layer 550.

Hereinafter, a manufacturing method for a transistor-type flexible nonvolatile ferroelectric memory device in accordance with an embodiment of the present disclosure will be explained in detail with reference to FIGS. 4A to 4E.

Figure 4A:
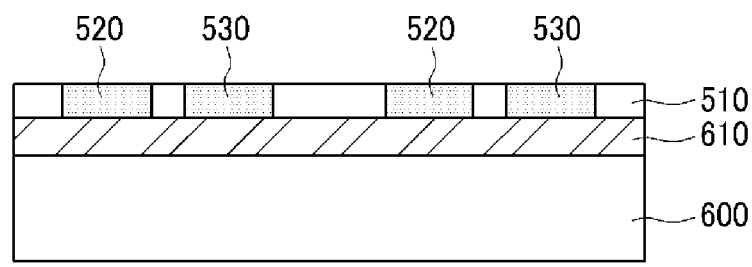
FIGS. 4A to 4E are schematic diagrams showing a manufacturing method for a transistor-type flexible nonvolatile ferroelectric memory device in accordance with an embodiment of the present disclosure.
Figure 4B:
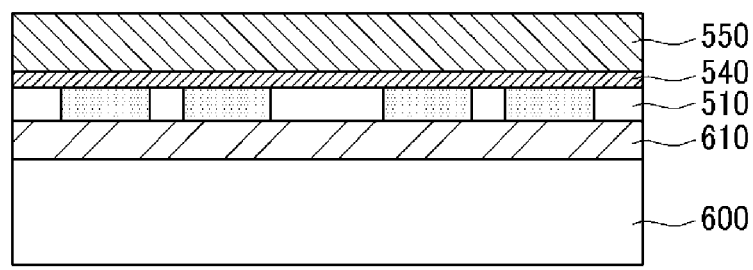
Figure 4C:
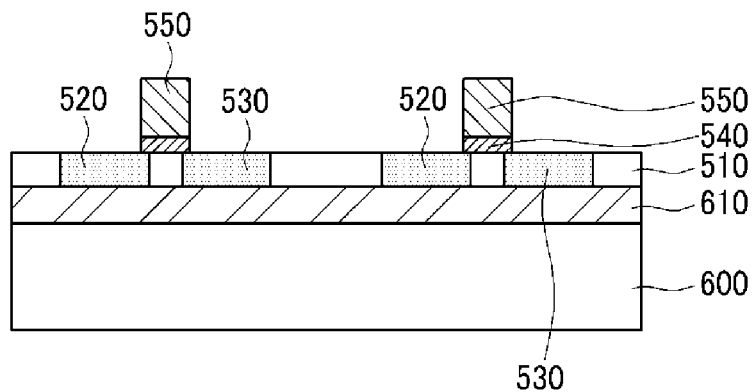

A sacrificial layer 610 and the semiconductor channel layer 510 may be formed on a substrate 600. The source/drain regions 520 and 530 may be formed on each side of the semiconductor channel layer 510 (FIG. 4A). Then, the barrier layer 540 may be formed on the entire surface of the semiconductor channel layer 510 in which the source/drain regions 520 and 530 are formed and the ferroelectric layer 550 may be formed on the barrier layer 540 (FIG. 4B).

A material forming the semiconductor channel layer 510 is not limited, and the semiconductor channel layer 510 may be formed using a semiconductor material known in the art. For example, the semiconductor channel layer may be formed using Si, a compound semiconductor, an oxide semiconductor, an organic semiconductor, carbon nanotube, or graphene, but not limited thereto.

In an embodiment, the barrier layer 540 may be an insulating layer. By way of example, the insulating barrier layer 540 may include a material selected from, but not limited to, a group consisting of $TiO_2$, $SrTiO_x$, $ZrO_2$, $LiNbO_3$, $SiO_2$, $Al_2O_3$ and a combination thereof.

In an embodiment, the ferroelectric layer 550 may include a material selected from, but not limited to, a group consisting of PZT (Lead Zirconate Titanate), PLZT (Lanthanum-modified Lead Zirconate Titanate), BLT (Bismuth Lanthanum Titanate), BST (Barium Strontium Titanate), SBT (Strontium Bismuth Tantalate) and a combination thereof. By way of example, the PZT can be expressed as, but not limited to, $[Pb(Zr_xTi_{1-x})O_3]$ in which x is greater than about 0.2 and less than about 0.8, the PLZT can be expressed as, but not limited to, $[(Pb_{1-y}La_y)(Zr_xTi_{1-x})O_3]$ in which x is greater than about 0.2 and less than about 0.8 and y is greater than about 0.01 and less than about 0.2, the BLT can be expressed as, but not limited to, $[Bi_{4-x}La_xTi_3O_{12}]$ in which x is greater than about 0.1 and less than about 2, the BST can be expressed as, but not limited to, $[(Ba_xSr_{1-x})TiO_3]$ in which x is greater than about 0.5 and less than about 1, and the SBT can be expressed as, but not limited to, $[Sr_xBi_yTa_2O_9]$ in which x is greater than about 0.5 and less than about 1.5 and y is greater than about 1.5 and less than about 3. The ferroelectric layer 550 may be formed by, for example, but not limited to, chemical vapor deposition (CVD), physical vapor deposition (PVD), sputtering, pulsed laser deposition (PLD) or a sol-gel method.

Figure 4D:
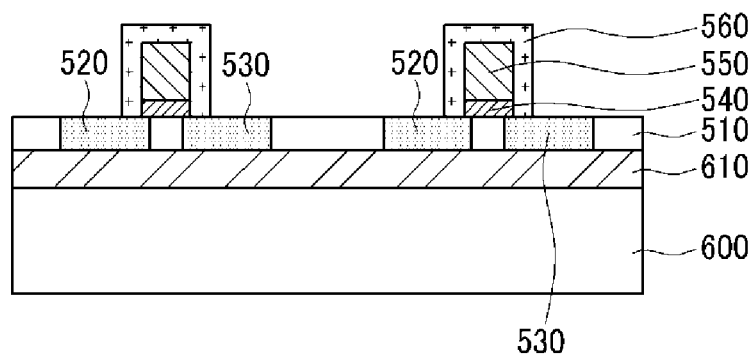

Thereafter, a pattern of the barrier layer 540 and ferroelectric layer 550 may be formed on each pattern of the semiconductor channel layer 510 (FIG. 4C) and a polymer protection layer 560 may be formed on the ferroelectric layer 550 (FIG. 4D).

In an embodiment, the polymer protection layer 560 may include a material selected from, but not limited to, a group consisting of photoresist (PR), epoxy resin, cytop, polyimide, benzocyclobutene, polydimethylsiloxane (PDMS), PMMA (Poly(methylmethacrylate)), polyurethane, polyvinylphenol, and a combination thereof. By way of example, the epoxy resin may include, but is not limited to, photoresist such as Su-8.

Subsequently, the sacrificial layer 610 may be removed by etching to separate adjacent elements from each other. The polymer protection layer 560 may protect the ferroelectric layer 550 while the sacrificial layer 610 is etched. The semiconductor channel layer 510, the source/drain regions 520 and 530 formed on each side of the semiconductor channel layer 510, the barrier layer 540 formed on the semiconductor channel layer 510, the ferroelectric layer 550 and the polymer protection layer 560 may be transferred onto the flexible substrate 500.

Figure 4E:
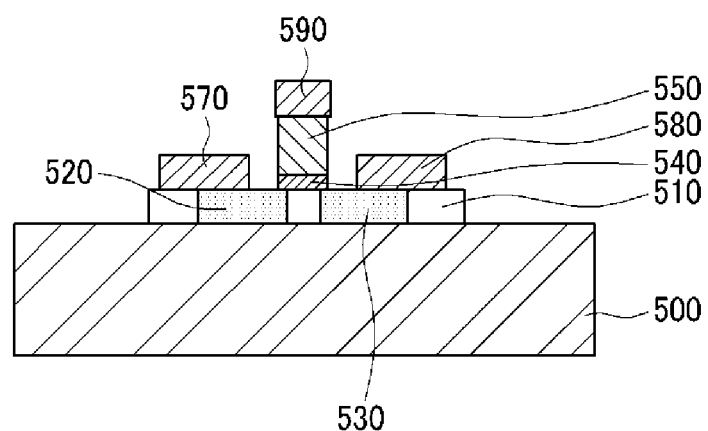

Then, after being transferred onto the flexible substrate 500, the polymer protection layer 560 may be removed. The source/drain electrodes 570 and 580 may be formed on the source/drain regions 520 and 530, and the gate electrode 590 may be formed on the ferroelectric layer 550 (FIG. 4E). The source/drain electrodes 570 and 580 and the gate electrode 590 may include, but is not limited to, metal selected from a group consisting of, for example, Ag, Au, Ni, Pt, Pd, Ir, Rh, Ta, W, Ti, Mo, Al, Cu and a combination thereof or a conductive oxide publicly known in the art. The source/drain electrodes 570 and 580 and the gate electrode 590 may be formed by, but not limited to, sputtering, e-beam evaporation, thermal evaporation, pulsed laser deposition (PLD), chemical vapor deposition (CVD), and atomic layer deposition (ALD) and may be patterned by, but not limited to, photolithography or lift-off.

The transistor-type ferroelectric nonvolatile memory device in accordance with an embodiment of the present disclosure can be manufactured through the above-described processes.

Figure 5:
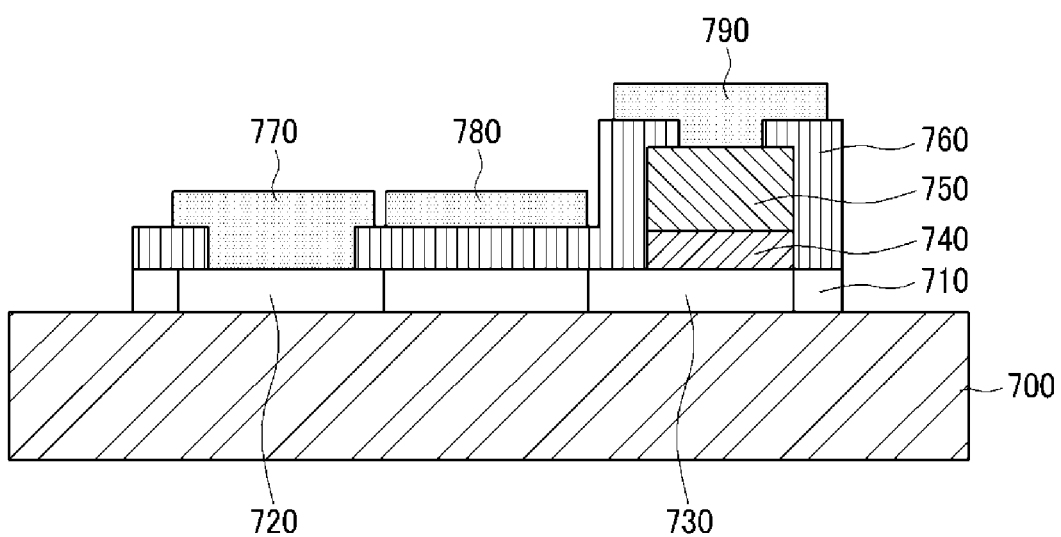
FIG. 5 is a cross-sectional view of a 1T-1R (1Transistor-1Resistor) flexible ferroelectric memory device in accordance with an embodiment of the present disclosure.

FIG. 5 is a cross-sectional view of a 1T-1R (1Transistor-1Resistor) flexible ferroelectric memory device in accordance with an embodiment of the present disclosure, and FIGS. 6A to 6H are schematic diagrams showing a manufacturing method for a 1T-1R (1Transistor-1Resistor) flexible ferroelectric memory device in accordance with an embodiment of the present disclosure.

Referring to FIG. 5, a 1T-1R (1Transistor-1Resistor) flexible ferroelectric memory device in accordance with an embodiment of the present disclosure may include a semiconductor channel layer 710 formed on a flexible substrate 700, source/drain regions 720 and 730 respectively formed on each side of the semiconductor channel layer 710, a barrier layer 740 formed on the drain region 730, a ferroelectric layer 750 formed on the barrier layer 740, a gate dielectric layer 760 formed on the semiconductor channel layer 710 and the ferroelectric layer 750, first and third electrodes 770 and 790 formed at positions where the source/drain regions 720 and 730 are opened, and a second electrode 780 formed on the gate dielectric layer 760 and between the first and third electrodes 770 and 790.

Hereinafter, a manufacturing method for a 1T-1R (1Transistor-1Resistor) flexible ferroelectric memory device in accordance with an embodiment of the present disclosure will be explained in detail with reference to FIGS. 6A to 6E.

Figure 6A:
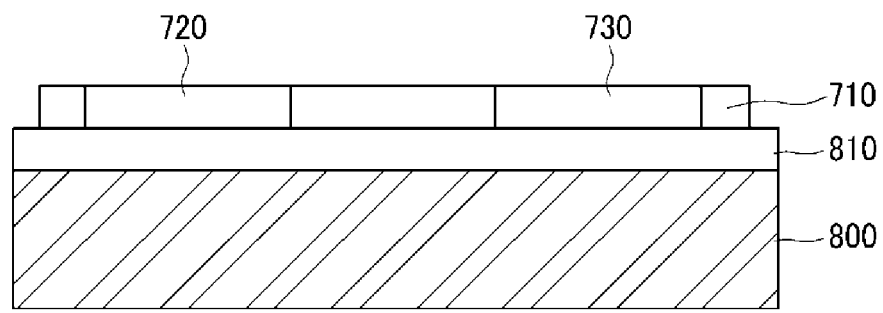
FIGS. 6A to 6H are schematic diagrams showing a manufacturing method for a 1T-1R (1Transistor-1Resistor) flexible ferroelectric memory device in accordance with an embodiment of the present disclosure.
Figure 6B:
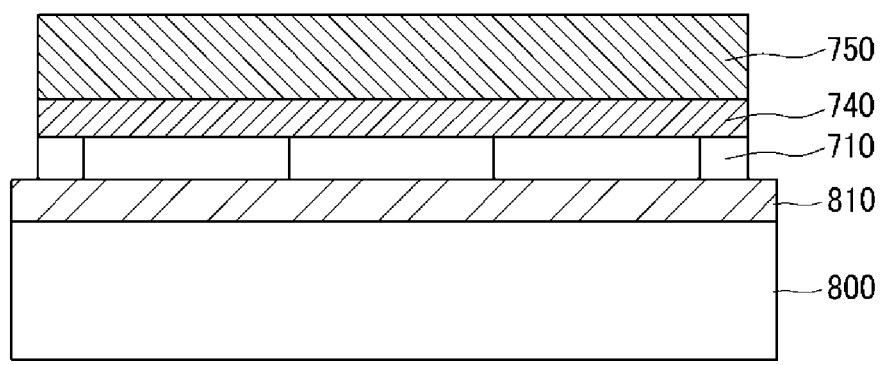
Figure 6C:
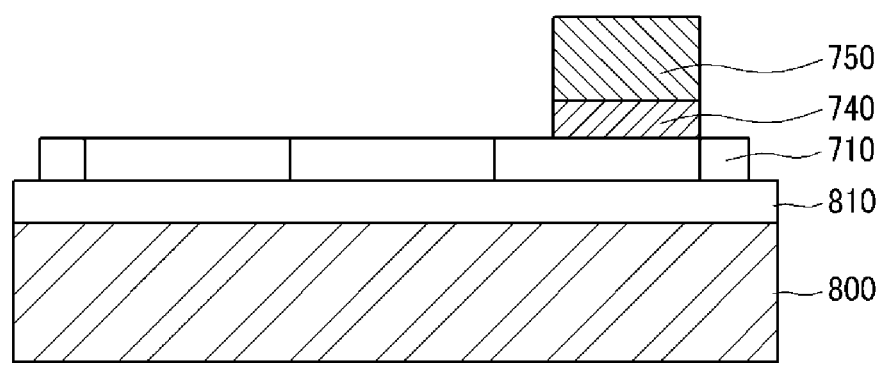

A sacrificial layer 810 and the semiconductor channel layer 710 may be formed on a substrate 800. The source/drain regions 720 and 730 may be formed on each side of the semiconductor channel layer 710 (FIG. 6A). Then, the barrier layer 740 may be formed on the entire surface of the semiconductor channel layer 710 on which the source/drain regions 720 and 730 are formed, and the ferroelectric layer 750 may be formed on the barrier layer 740 (FIG. 6B).

A material forming the semiconductor channel layer 710 is not limited, and the semiconductor channel layer 710 may be formed using a semiconductor material known in the art. For example, the semiconductor channel layer may be formed using Si, a compound semiconductor, an oxide semiconductor, an organic semiconductor, carbon nanotube, or graphene, but not limited thereto.

In an embodiment, the barrier layer 740 may be an insulating layer. By way of example, the barrier layer 740 may include a material selected from, but not limited to, a group consisting of Pt, Ir, Ru, Rh, SrO, PdO, IrO$_x$, RuO$_x$, RhO$_x$, OsO$_x$ and a combination thereof.

In an embodiment, the ferroelectric layer 750 may include a material selected from, but not limited to, a group consisting of PZT (Lead Zirconate Titanate), PLZT (Lanthanum-modified Lead Zirconate Titanate), BLT (Bismuth Lanthanum Titanate), BST (Barium Strontium Titanate), SBT (Strontium Bismuth Tantalate) and a combination thereof. By way of example, the PZT can be expressed as, but not limited to, [Pb(Zr$_x$Ti$_{1-x}$)O$_3$] in which x is greater than about 0.2 and less than about 0.8, the PLZT can be expressed as, but not limited to, [(Pb$_{1-y}$La$_y$)(Zr$_x$Ti$_{1-x}$)O$_3$] in which x is greater than about 0.2 and less than about 0.8 and y is greater than about 0.01 and less than about 0.2, the BLT can be expressed as, but not limited to, [Bi$_{4-x}$La$_x$Ti$_3$O$_{12}$] in which x is greater than about 0.1 and less than about 2, the BST can be expressed as, but not limited to, [(Ba$_x$Sr$_{1-x}$)TiO$_3$] in which x is greater than about 0.5 and less than about 1, and the SBT can be expressed as, but not limited to, [Sr$_x$Bi$_y$Ta$_2$O$_9$] in which x is greater than about 0.5 and less than about 1.5 and y is greater than about 1.5 and less than about 3.

The ferroelectric layer 750 may be formed by, for example, but not limited to, chemical vapor deposition (CVD), physical vapor deposition (PVD), sputtering, pulsed laser deposition (PLD) or a sol-gel method.

Figure 6D:
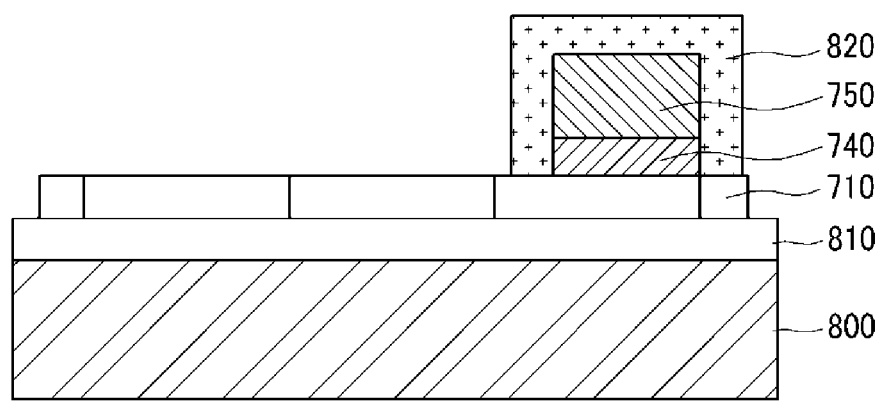

Thereafter, a pattern of the barrier layer 740 and ferroelectric layer 750 may be formed on each pattern of the semiconductor channel layer 810 and may be etched (FIG. 6C), and a protection layer 820 may be formed on the ferroelectric layer 750 (FIG. 6D).

In an embodiment, the protection layer 820 may include, but is not limited to, photoresist (PR). The photoresist can be appropriately selected by those skilled in the art from those publicly known in the art and used without limit. The protection layer 820 may include a material selected from, for example, but not limited to, a group consisting of epoxy resin, cytop, polyimide, benzocyclobutene, polydimethylsiloxane (PDMS), PMMA (Poly(methylmethacrylate)), polyurethane, polyvinylphenol, and a combination thereof. By way of example, the epoxy resin may include, but is not limited to, Su-8.

Figure 6E:
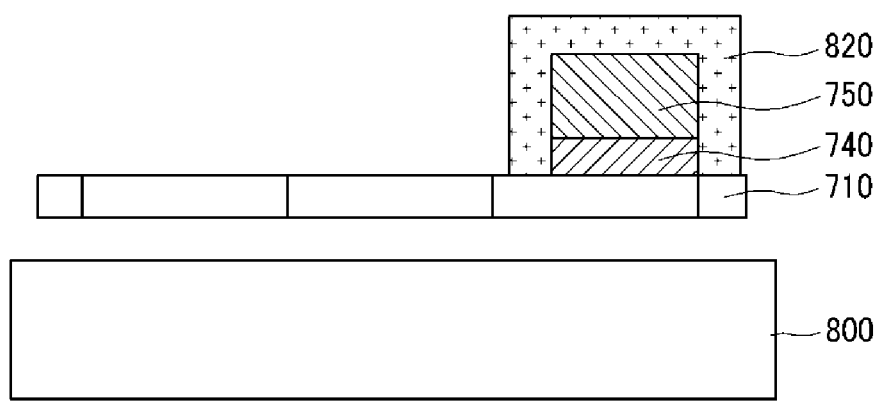

Subsequently, the sacrificial layer 710 may be removed by etching (FIG. 6E). The protection layer 820 may protect the ferroelectric layer 750 while the sacrificial layer 710 is etched. The semiconductor channel layer 810 divided by etching the sacrificial layer 710, the barrier layer 740, the ferroelectric layer 750 and the protection layer 820 may be transferred onto the flexible substrate 700.

Figure 6F:
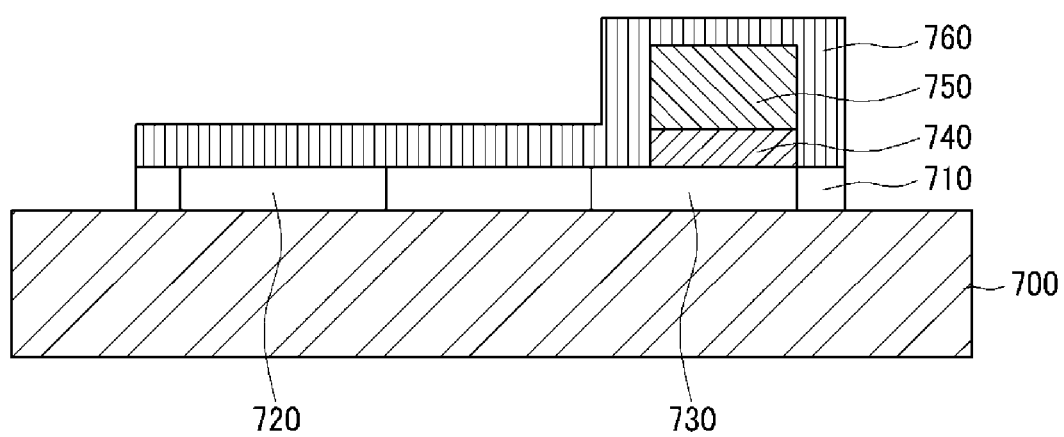
Figure 6G:
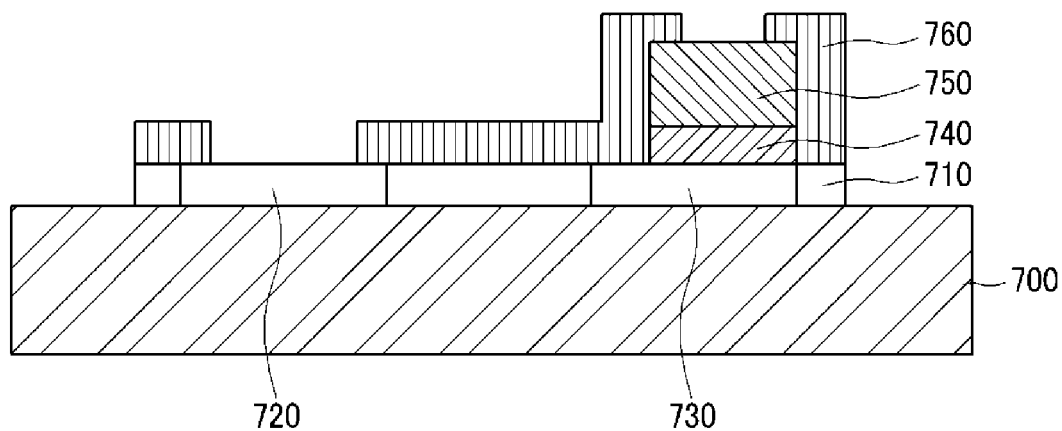

Then, after being transferred onto the flexible substrate 700, the protection layer 820 may be removed, and the gate dielectric layer 760 may be formed on the semiconductor channel layer 810 and the ferroelectric layer 750 (FIG. 6F).

Figure 6H:
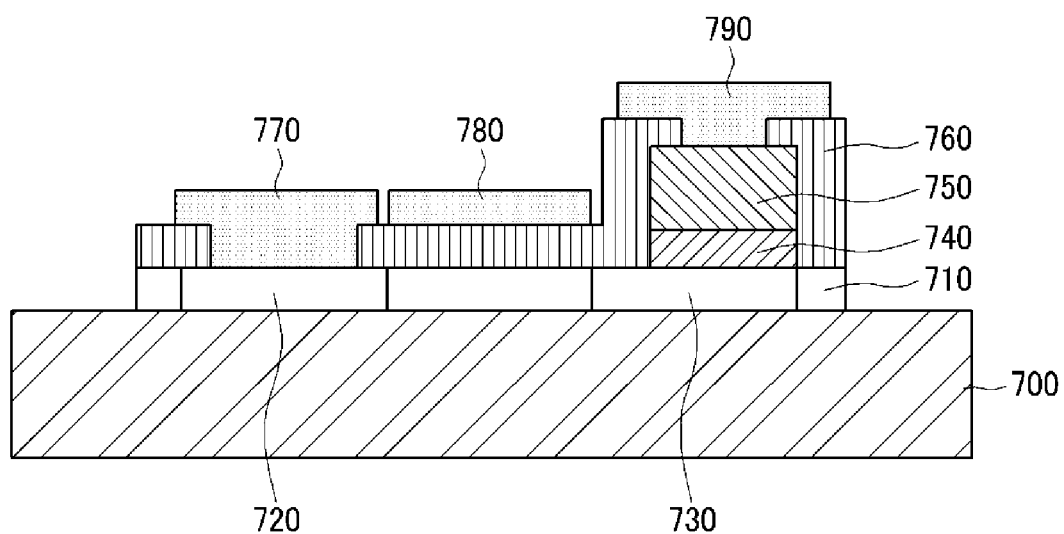

Thereafter, the source/drain regions 720 and 730 may be opened (FIG. 6G) and the first electrode 770, the second electrode 780 and the third electrode 790 may be formed above the open source/drain regions 720 and 730 (FIG. 6H). The first electrode 770, the second electrode 780, and the third electrode 790 may include, but is not limited to, a metal selected from a group consisting of, for example, Ag, Au, Ni, Pt, Pd, Ir, Rh, Ta, W, Ti, Mo, Al, Cu and a combination thereof or a conductive oxide publicly known in the art. The first electrode 770, the second electrode 780, and the third electrode 790 may be formed by, but not limited to, sputtering, e-beam evaporation, thermal evaporation, pulsed laser deposition (PLD), chemical vapor deposition (CVD), and atomic layer deposition (ALD) and may be patterned by, but not limited to, photolithography or lift-off.

The 1T-1R (1Transistor-1Resistor) flexible ferroelectric memory device in accordance with an embodiment of the present disclosure can be manufactured through the above-described processes.

Hereinafter, some examples will be provided for further detailed explanation of the present invention. However, the present invention is not limited to these examples.

Example 1

Ferroelectric Thin Film Transistor for Flexible Ferroelectric Memory Device

A lower electrode was formed by depositing Pt (about 80 nm) and Ti (about 20 nm) on a SiO$_2$ (about 300 nm)/Si substrate by using a RF sputter. A ferroelectric material, PZT was formed to have a thickness of about 360 nm by a sol-gel method and then was preformed a heat treatment at about 650° C. for about 30 minutes to impart high polarization property. After source/drain regions were heavily n-doped on a lightly p-doped SOI substrate and a sacrificial layer was removed with hydrofluoric acid, a silicon thin film to be transferred onto the PZT substrate PZT was separated from a mother substrate by using a rubber stamp. A PZT/Pt/Ti/SiO$_2$/Si substrate was spin-coated with 10%-diluted Su-8 and treated UV for about 10 seconds, and the rubber stamp with a Si thin film attached thereto was brought into contact with the Su-8. While the Su-8 and the Si thin film were in contact with each other, they were under a heat treatment at about 75° C. for about 10 minutes and at about 85° C. for about 10 minutes. Through the heat treatment, a bonding force between the Su-8 and the Si thin film was increased. The rubber stamp was removed and the transcription of the Si thin film was completed. In order for the Su-8 to be completely hardened, the heat treatment was performed at about 115° C. for about 30 minutes, and an isolation process was performed to divide elements in the transferred Si thin film. After source/drain electrodes were formed, a final device was completed.

Figure 7A:
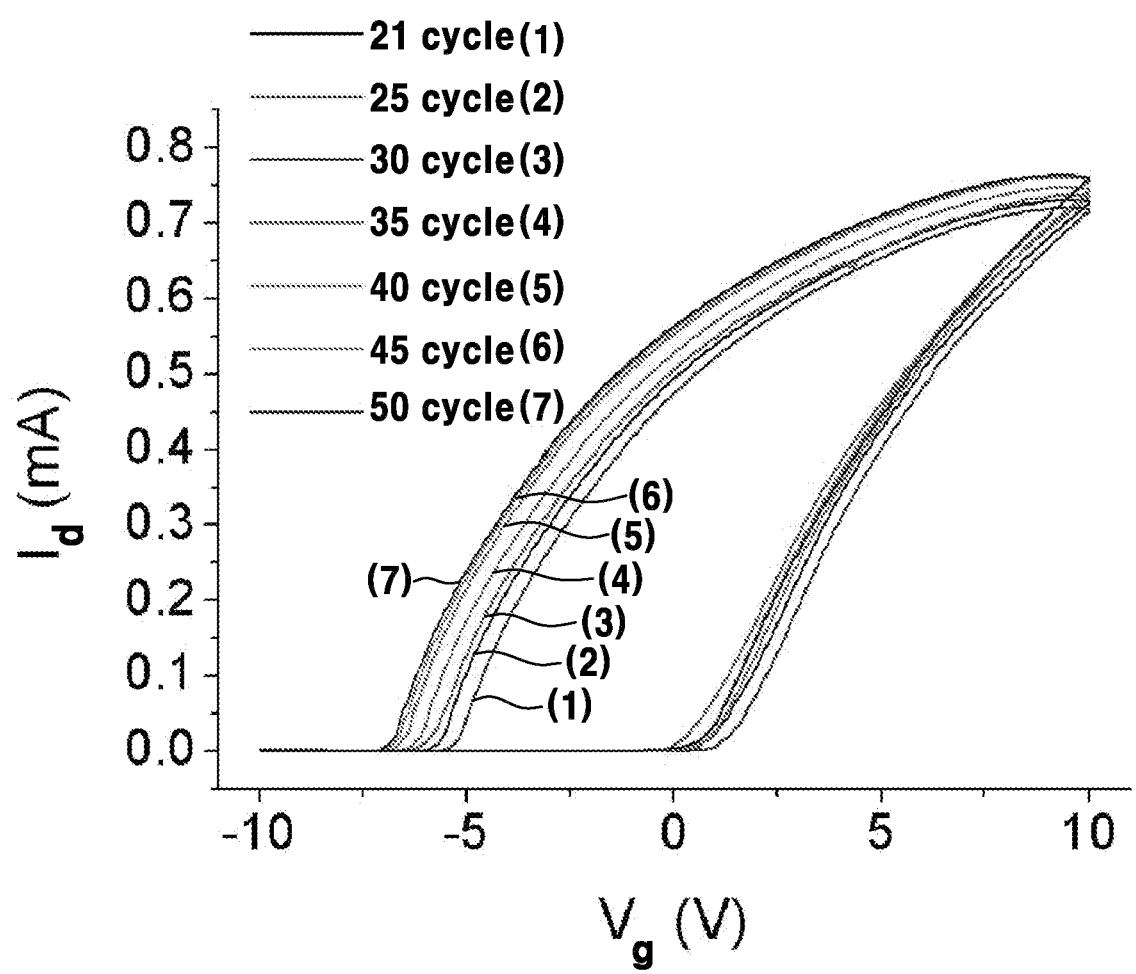
FIG. 7A is a graph showing a drain current property depending on a gate voltage of a ferroelectric thin film transistor in accordance with an embodiment of the present disclosure.
Figure 7B:
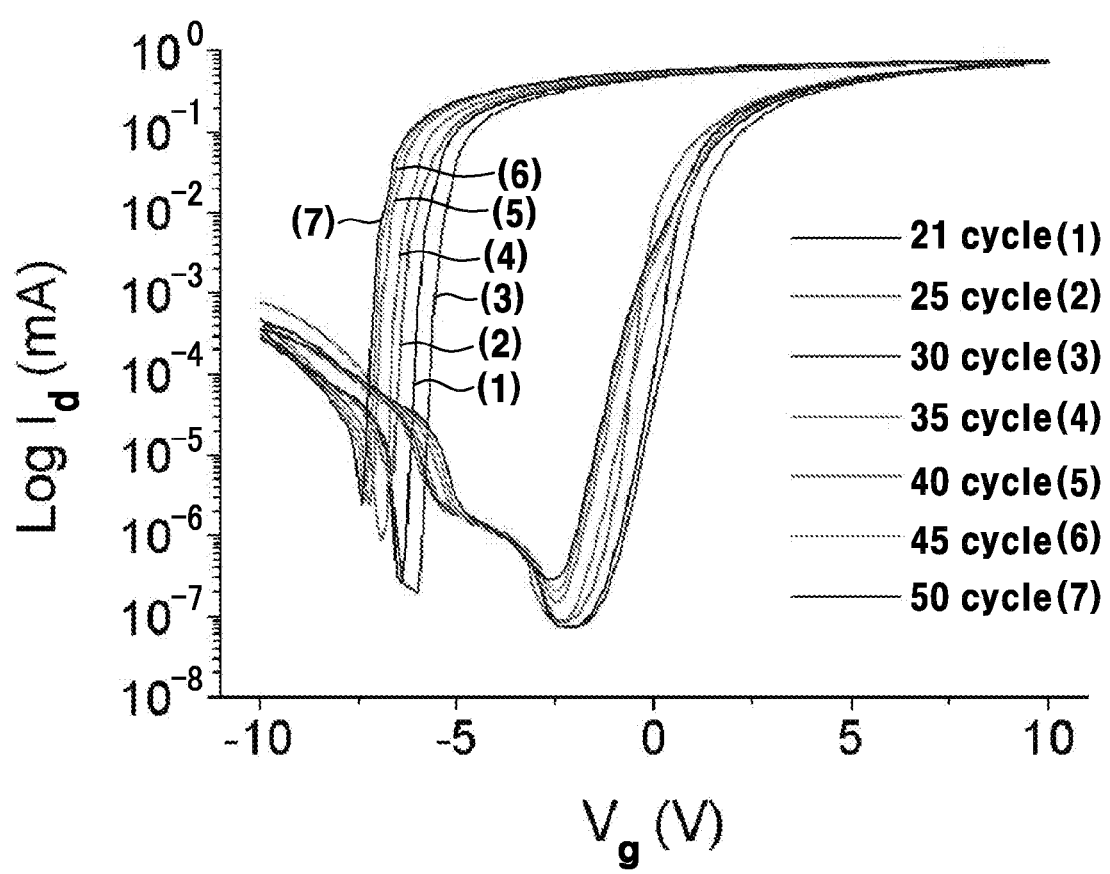
FIG. 7B is a graph showing a current property of a log value converted from the drain current of the graph in FIG. 7A.

FIG. 7A is a graph showing a drain current property depending on a gate voltage of a flexible ferroelectric thin film transistor in accordance with an embodiment of the present disclosure. Referring to FIG. 7A, it can be seen from the graph that a threshold voltage varied depending on a changing direction of a gate voltage and any significant change was not found despite repeated measurements unlike a graph showing general properties of a thin film transistor caused by polarization of a ferroelectric material. This can be clearly seen from FIG. 7B that shows a current property of a log value converted from the drain current of the graph in FIG. 7A.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

The scope of the present invention is defined by the following claims rather than by the detailed description of the embodiments. It shall be understood that all modifications and embodiments conceived from the meaning and scope of the claims and their equivalents are included in the scope of the present invention.

EXPLANATION OF CODES

300: Flexible substrate
310: Semiconductor channel layer

320: Source region
330: Drain region
340: Polymer adhesive layer
350: First insulating layer
360: Second insulating layer
370: Ferroelectric layer
380: Gate electrode
390: Source electrode
400: Drain electrode
410: Substrate
420: First insulating layer
430: Sacrificial layer
440: Stamp
500: Flexible substrate
510: Semiconductor channel layer
520: Source region
530: Drain region
540: Barrier layer
550: Ferroelectric layer
560: Polymer protection layer
570: Source electrode
580: Drain electrode
590: Gate electrode
600: Substrate
610: Sacrificial layer
700: Flexible substrate
710: Semiconductor channel layer
720: Source region
730: Drain region
740: Barrier layer
750: Ferroelectric layer
760: Gate dielectric layer
770: First electrode
780: Second electrode
790: Third electrode
800: Substrate
810: Sacrificial layer
820: Protection layer

What is claimed is:

1. A transistor-type flexible nonvolatile ferroelectric memory device comprising:
a semiconductor channel layer formed on a flexible substrate;
source/drain regions respectively formed on each side of the semiconductor channel layer;
a polymer adhesive layer formed on the semiconductor channel layer;
a first insulating layer formed on the polymer adhesive layer;
a second insulating layer formed on the first insulating layer;
a ferroelectric layer formed on the second insulating layer;
a gate electrode formed on the ferroelectric layer; and,
source/drain electrodes respectively formed on the source/drain regions.

2. The transistor-type flexible nonvolatile ferroelectric memory device of claim 1,
wherein each of the first insulating layer and the second insulating layer includes a material selected from a group consisting of $TiO_2$, $SrTiO_x$, $ZrO_2$, $LiNbO_3$, $Al_2O_3$ $SiO_2$ and a combination thereof.

3. The transistor-type flexible nonvolatile ferroelectric memory device of claim 1,
wherein the polymer adhesive layer includes a material selected from a group consisting of epoxy resin, cytop, polyimide, benzocyclobutene, polydimethylsiloxane (PDMS), PMMA (Poly(methylmethacrylate)), polyurethane, polyvinylphenol, and a combination thereof.

4. The transistor-type flexible nonvolatile ferroelectric memory device of claim 1,
wherein the ferroelectric layer is formed by a vacuum deposition or a sol-gel method.

5. A transistor-type flexible nonvolatile ferroelectric memory device comprising:
a semiconductor channel layer formed on a flexible substrate;
source/drain regions respectively formed on each side of the semiconductor channel layer;
a barrier layer formed on the semiconductor channel layer;
a ferroelectric layer formed on the barrier layer;
source/drain electrodes respectively formed on the source/drain regions; and
a gate electrode formed on the ferroelectric layer.

6. The transistor-type flexible nonvolatile ferroelectric memory device of claim 5, wherein the barrier layer is an insulating layer.

7. The transistor-type flexible nonvolatile ferroelectric memory device of claim 6, wherein the insulating barrier layer includes a material selected from a group consisting of $TiO_2$, $SrTiO_x$, $ZrO_2$, $LiNbO_3$, $Al_2O_3$, $SiO_2$ and a combination thereof.

8. The transistor-type flexible nonvolatile ferroelectric memory device of claim 5,
wherein the ferroelectric layer is formed by a vacuum deposition or a sol-gel method.

* * * * *

UNITED STATES PATENT AND TRADEMARK OFFICE
CERTIFICATE OF CORRECTION

PATENT NO. : 8,729,614 B2  
APPLICATION NO. : 13/115268  
DATED : May 20, 2014  
INVENTOR(S) : Jong-Hyun Ahn Page 1 of 1

It is certified that error appears in the above-identified patent and that said Letters Patent is hereby corrected as shown below:

In the Specification

Column 4, line 22, replace "$LiNbO_2$" with - $LiNbO_3$ -

Signed and Sealed this  
Ninth Day of September, 2014

Michelle K. Lee  
*Deputy Director of the United States Patent and Trademark Office*